United States Patent [19]

Brahmbhatt

[11] Patent Number: 4,460,979
[45] Date of Patent: Jul. 17, 1984

[54] MEMORY CELL

[75] Inventor: Dhaval J. Brahmbhatt, San Jose, Calif.

[73] Assignee: Honeywell Inc., Minneapolis, Minn.

[21] Appl. No.: 379,809

[22] Filed: May 19, 1982

[51] Int. Cl.³ ............................................. G11C 11/40
[52] U.S. Cl. ...................................... 365/182; 357/40
[58] Field of Search .................. 365/174, 182; 357/40, 357/41, 45

[56] References Cited

U.S. PATENT DOCUMENTS

| 4,203,158 | 5/1980 | Frohman-Bentchkowsky et al. | 365/185 |
| 4,257,056 | 3/1981 | Shum | 357/23 |
| 4,263,664 | 4/1981 | Owen et al. | 365/185 |

Primary Examiner—Terrell W. Fears
Attorney, Agent, or Firm—Theodore F. Neils

[57] ABSTRACT

An electrically erasable, programmable read-only-memory cell compatible with a high voltage value generator for writing and erasing in the cell being in the same chip.

34 Claims, 7 Drawing Figures

MEMORY CELL

BACKGROUND OF THE INVENTION

The present invention relates to monolithic integrated circuit memories and, more particularly, to erasable, programmable read-only memory cells provided in semiconductor monolithic integrated circuits.

The use of read-only-memories has become common in digital electronic circuits as a long-term storage means of selected information pertinent to the operation of the digital electronics system involved. The term "read-only memory" implies that information stored in such a memory is not changed during operation of the system employing that memory through some "writing" operation. However, practice has shown the convenience and desirability of having memory circuits which are "read" most of the time, that is, retrieving the information stored therein, but in which system the stored information can at least be altered on occasion. Thus, semiconductor monolithic integrated circuit read-only memory systems have been developed which more or less frequently can have the information contained therein "erased" and newly selected information substituted, i.e. "written" or "programmed" therein, for reading in the future.

Already known are semiconductor monolithic integrated circuit read-only-memory systems in which the stored information can be erased through the use of (i) ultraviolet light as the erasing means, or through the use of (ii) electrical means serving as the basis for erasing information come to be known as electrically erasable programmable Thereafter, reprogramming of these systems can be effected so they store therein newly selected information. The latter memory systems have come to be known as electrically erasable, programmable read-only-memory system, i.e. E²PROM. However, erasing the stored information contained in E²PROM's in many of the designs therefor, or programming such information into same, has required a substantial amount of electrical power along with the use of relatively high voltages necessitating that a user of such memory systems provide external circuitry capable of such voltages and power. That is, because the amount of electrical power needed, a generator of sufficient voltage magnitudes can not be conveniently provided in the same monolithic integrated circuit chip in which the E²PROM was to be provided. Thus, the user is required to provide further external circuitry to make full use of the capabilities of such E²PROM designs. Therefore, an E²PROM which would be operable with only relatively low voltages being supplied from external sources to the monolithic integrated circuit chip in which it is formed is desirable where this is accomplished through providing a high voltage generating circuit means in the same chip as the memory system. This arrangement would free users of such E²PROM's systems from having to supply external high voltage means in an electronic system employing E²PROM's.

SUMMARY OF THE INVENTION

An electrically erasable, programmable read-only-memory cell for a semiconductor monolithic integrated circuit memory is provided capable of storing information by varying the effective threshold of a memory device in such memory cell through operating a tunneling capacitance. This tunneling phenomena can be used to program or erase to effectively control the threshold of such memory device with the result that the selecting of that cell to read information stored therein leads to different cell outputs depending on the memory device threshold at the time of the reading.

This memory device is typically an insulated gate field-effect transistor having as a gate an electrically isolated, extended conductor serving also as a portion of the tunneling capacitance in which it is separated by a thin insulator from a portion of the semiconductor material in which a diffused region is provided as another part of that tunneling capacitance. The memory device has a selecting device in a series therewith having an essentially constant threshold. The tunneling capacitance has a control device in a series therewith. A coupling capacitance is formed having a portion thereof electrically connected to the tunneling capacitance; in particular, this coupling capacitance has one side thereof electrically connected to the extended conductor serving as both a gate of the memory device and as one side of the tunneling capacitance. This connection could result from use of a common structure.

DESCRIPTION OF THE PREFERRED EMBODIMENTS

Figure 1:
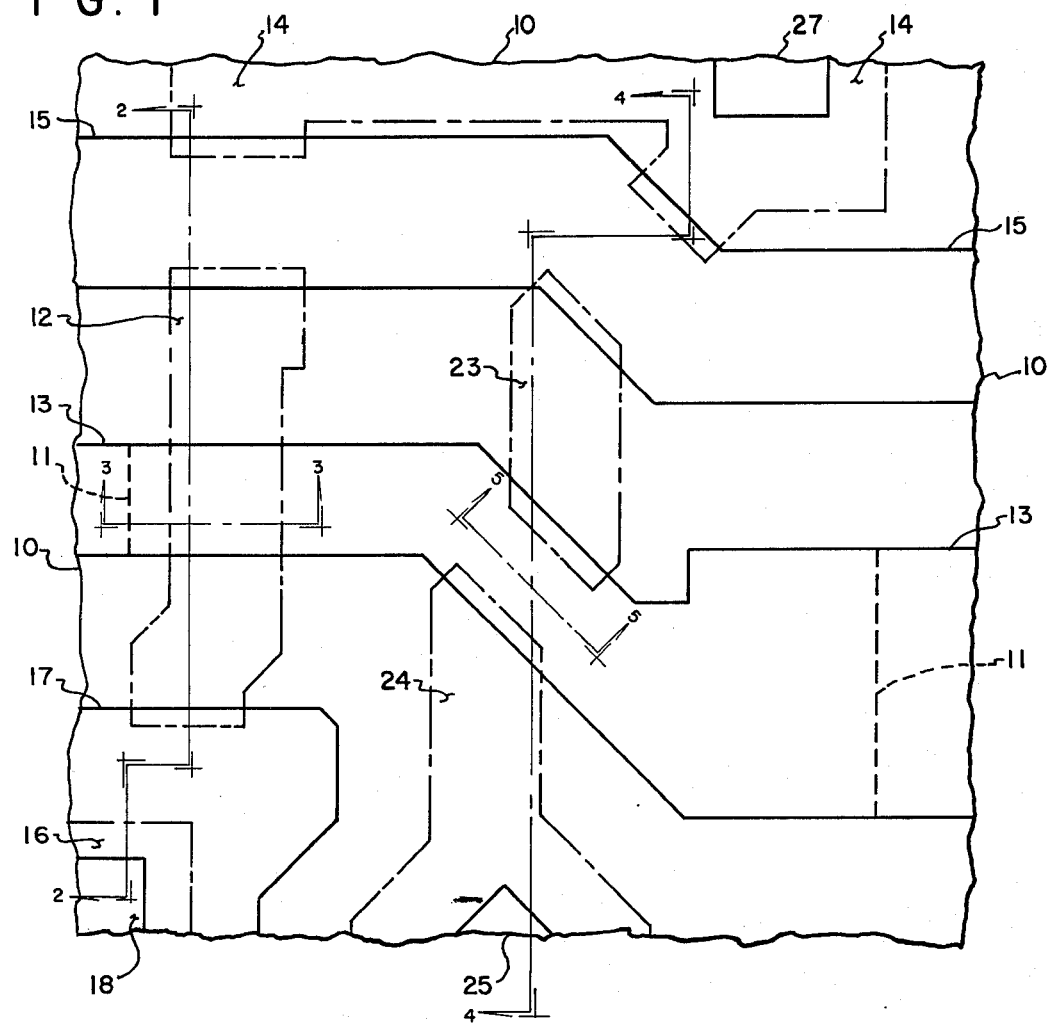
FIG. 1 is a representation of a plan view of a portion of a monolithic integrated circuit embodying the present invention.

FIG. 1 shows a layout or plan view of a portion of a semiconductor material based monolithic integrated circuit chip containing a an electrically erasable, programmable read-only-memory cell embodying the present invention. This cell is formed on a semiconductor material substrate, 10, over which are provided several structural portions as a part of this memory cell. This cell shown in FIG. 1 has outside dimensions of typically 20 μm by 25 μm using common fabrication methods. Doped areas in semiconductor substrate 10 are outlined in FIG. 1 by alternating long and short dashed lines. The solid lines depict, variously, the edges of openings for metalization structures or the edges of remaining portions of a second doped polycrystalline silicon ("polysilicon") layer, that is, a layer of doped polysilicon in the structures above the substrate that is closer to the observer of FIG. 1 than are remaining portions of a first layer of doped polysilicon in these same structures. These first polysilicon layer portions occur directly under some of the second polysilicon layer portions with those portions of this first polysilicon layer which are not coextensive with the second layer being shown by short dashed lines in FIG. 1.

For purposes of FIG. 1, certain structures contained in a finished monolithic integrated circuit chip have been omitted in this view, nevertheless, these structures are sometimes shown in subsequent cross section views taken of FIG. 1 as provided in other figures in the present drawings. Thus, for instance, the normally used metal and passivation layers are not shown in FIG. 1 so that solid lines are used for structures based on the remaining portions of the second polysilicon layer rather than dotted or dashed lines which would otherwise be used to indicate that structures are covered by passivation materials. However, in practice, a final completed integrated circuit chip has such polysilicon structures covered by such omitted materials.

To further clarify the invention shown in FIG. 1, several cross section views are made thereof as indicated by cross section lines. Each cross section line has a number at each end thereof, where these numbers correspond to the subsequent figure in which that cross section view is shown though not necessarily in the same scale as FIG. 1. Features that are common to more than one figure are referenced by common designation symbols in each.

Figure 2:
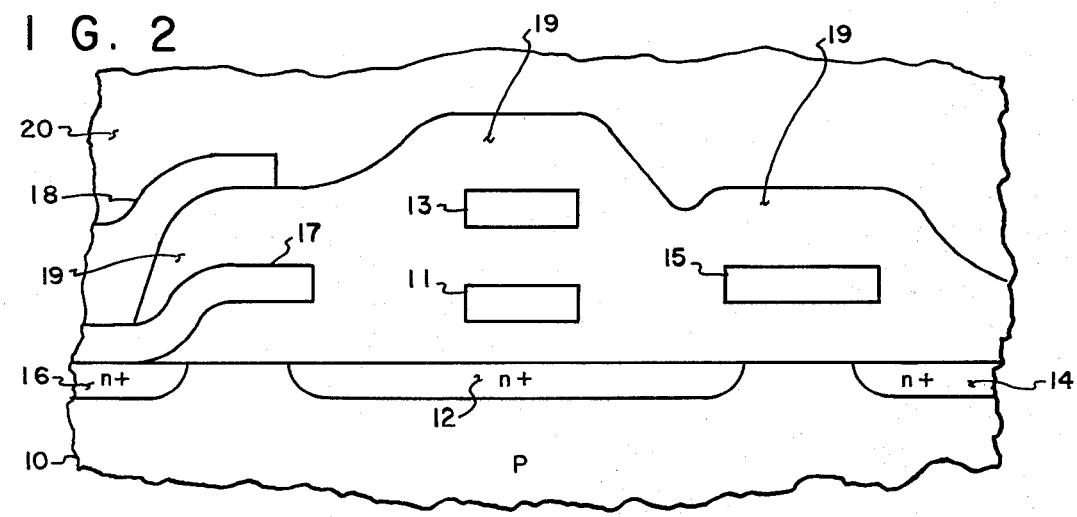
FIG. 2 is a cross section view of a portion of the monolithic integrated circuit of FIG. 1.

Thus in FIG. 2, there is shown a cross section view which includes a tunneling capacitance based on Fowler-Nordheim tunneling. This is comprised of a portion of the first polysilicon layer, 11, over a diffused region, 12, with this portion and this region separated by a thin layer of a silicon oxide, typically silicon dioxide, having a thickness of between 70 and 200 Å.

Polysilicon layer 11, as shown in FIG. 2, is doped with phosphorous to render it quite conductive. The major portions of substrate 10 as shown in this figure are doped to have a p-type conductivity by providing boron therein in sufficient quantity such that a substrate 10 has a resistivity of 35–50Ω-cm. Region 12 is formed through ion implantation of phosphorous ions with a dose of $5 \times 10^{15}$ ions/cm$^2$ at 40 kev to provide a region of n+-type conductivity having a junction depth of approximately 1.0 μm. Note that directly above tunneling capacitance polysilicon structure 11 is another polysilicon structure, 13, which is formed from a portion of the second layer of polysilicon. This polysilicon structure is also doped with phosphorous to make it very conductive. Structure 13 is separated from first layer polysilicon structure 11 by a silicon oxide, again, typically silicon dioxide, of approximately 500 to 1000 Å in thickness to thereby form another capacitive structure involving structure 11, but one which does not involve tunneling.

In operation, a sufficient voltage between first layer polysilicon structure 11 of FIG. 2 and diffusion 12 will lead to electric charge tunneling through the silicon oxide region between the structures, at those locations therein where the voltage is high enough to cause significant Fowler-Nordheim tunneling current such that any required charge transfer is obtained in a reasonable time period. A sufficiently positive voltage on structure 11 with respect to diffusion 12 will lead to electrons tunneling through the separating oxide to reach structure 11 where they will remain indefinitely in the absence of other electrical stimuli because structure 11 is entirely surrounded in the memory cell by an electrically insulating oxide, i.e. structure 11 is a "floating gate". Reversing the polarity of this voltage can lead to removing such electrons from structure 11, again by tunneling through the oxide between structures 11 and 12, to thereby reach diffusion 12.

To the right of the tunneling capacitance structure in FIG. 2 is a structure forming a control insulated gate field-effect transistor, in this case a metal-oxide-semiconductor ("MOS") field-effect transistor for operating in the enhancement mode. A further n+-type conductivity region, 14, is provided in substrate 10 through doping that region with ions of arsenic or phosphorus in an approximate dose of $5 \times 10^{15}$ ions/cm$^2$ at approximately 30 to 40 kev in an ion implantation step to provide region 14 with a junction depth of 1.0 μm. The control transistor structure in FIG. 2 is then formed by regions 12 and 14 serving as drain or source regions therein along with a gate structure, 15, also formed by a portion of the doped second polysilicon layer. Note that the gate structure for the control transistor formed by second polysilicon layer 15 is separated from the substrate 10 by silicon oxide having a greater thickness than that separating structure 11 from region 12 since tunneling is not desired in this transistor structure, the thickness of this gate oxide being on the order of 800 Å.

An erase transistor structure is shown to the left of the tunneling capacitance structure in FIG. 2, which is again an insulated gate field-effect transistor in the form of a MOS field-effect transistor for operating in the enhancement mode. Another n+-type conductivity implanted region, 16, is shown formed in substrate 10 which is formed simultaneously with, and so has the same characteristics as region 12. Again, regions 12 and 16 together serve as drain or source regions in this erase transistor structure and, along with the gate structure, 17, formed again in the doped second polysilicon layer, comprise the transistor.

As can be seen from FIG. 2, gate structure 17 is electrically connected to region 16. Also electrically connected to gate structure 17 is a metallization structure, 18, which represents a metallization interconnection for supplying signals to or from other locations on the chip to both gate structure 17 and region 16. Again gate structure 17 is separated from the erase transistor channel region between regions 12 and 16 by silicon oxide, typically silicon dioxide, with a thickness on the order of 800 Å as there is no desire for any tunneling to occur in this structure either.

Figure 3:
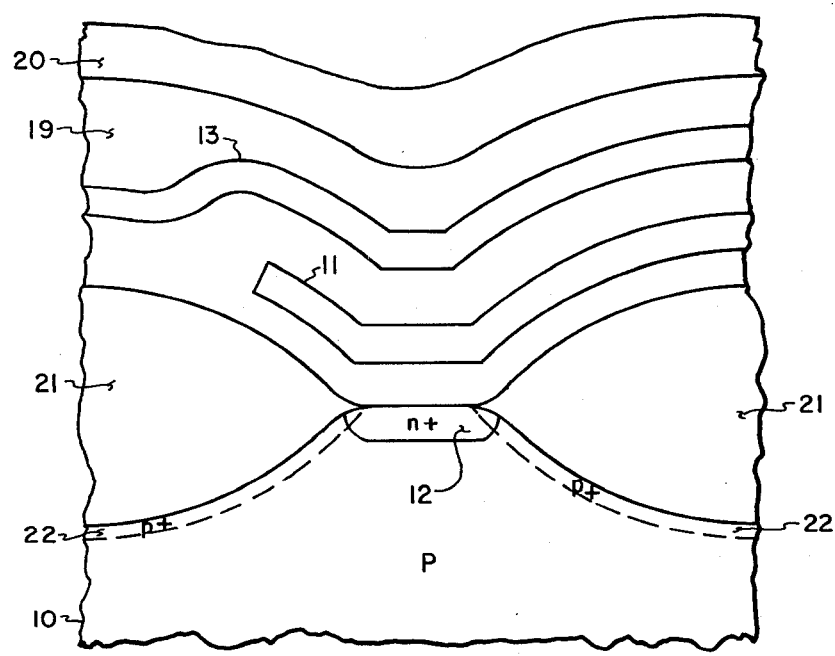
FIG. 3 is a cross section view of a portion of the monolithic integrated circuit of FIG. 1.

FIG. 3 shows another cross section view of FIG. 1 taken across the cross section view shown in FIG. 2 through the tunneling capacitance. Again present is p-type conductivity substrate 10 and n+-type conductivity region 12. Above region 12 is shown first layer polysilicon structure 11 again which is a part of both the tunneling capacitance involving region 12 and part of the further capacitance formed with second layer polysilicon structure 13 also shown in FIG. 3. Note that in both FIGS. 2 and 3 that a protective layer, 19, of phosphorus doped vapor deposited oxide (PVX) having an approximate thickness of 1.0 μm is provided over second layer polysilicon structure 13 upon which metallization interconnection structures are thereafter formed, such as metallization interconnection 18. A passivation layer, 20, of phosphorus doped SiO$_2$ having an approximate thickness of 1.1 μm is provided over the resulting metallization interconnections, such as 18, and over the exposed portions of the protective layer 19 as shown in both FIGS. 2 and 3.

Additional features shown in FIG. 3 which do not appear in FIG. 2 are field oxide regions, 21, formed in regions of FIG. 1 structure where circuit device features are not to be provided, these field oxide regions 21 being provided for purposes of electrical isolation. The thickness of field oxide regions 21 is approximately 1.0 m and they are a silicon oxide typically silicon dioxide. In addition, p+-type conductivity implant regions, 22, are shown in FIG. 3 beneath field oxide regions 21 to increase the threshold voltage of the polysilicon-oxide-semiconductor structure shown there to reduce the possibility of channeling occurring between various n-type conductivity regions formed in substrate 10. Regions 22 are formed by implanting boron ions with an approximate dose of $4 \times 10^{13}$ ions/cm$^2$ at approximately 75 kev prior to the growth of field oxide regions 21.

Figure 4:
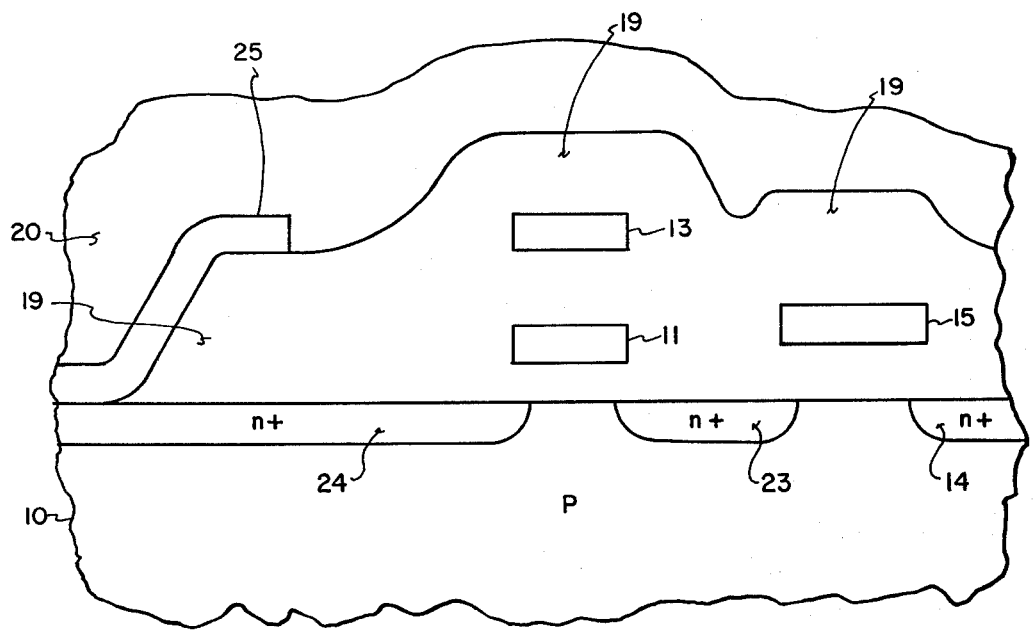
FIG. 4 is a cross section view of a portion of the monolithic integrated circuit of FIG. 1.

FIG. 4 shows a cross section view of two insulated gate field-effect transistor structures, one being a memory transistor which has its threshold in effect varied by the charge accumulated on first layer polysilicon structure 11, and the other being a selection transistor having an essentially fixed or constant threshold. Both of these transistors are shown in FIG. 4 as MOS field-effect transistors with the select transistor for operation in the enhancement mode while the memory device effectively varies in operation between enhancement and depletion modes depending on what the state of the memory cell is with respect to what has been "written" therein.

The memory transistor comprised of first layer polysilicon structure 11 and two n+-type conductivity regions, 23 and 24. These regions are defined by ion implantation in a common fabrication step with region 12. Regions 23 or 24 serve as drain or source regions of the memory transistor Regions with structure 11 serving as the gate thereof separated by silicon oxide from the transfer channel region located between regions 23 and 24. This gate oxide is typically silicon dioxide having a thickness of approximately 500 to 1000 Å. Second layer polysilicon structure 13, as again seen in FIG. 4, is again separated as before from structure 11 by 500 to 1000 Å of silicon dioxide continuing the capacitive arrangement with structure 11 seen previously in FIGS. 2 and 3.

The selection transistor is comprised of regions 14 and 23 serving as drain or source regions along with second layer polysilicon portion 15 serving as a gate thereof. Structure 15 is separated from the transistor channel region located between regions 14 and 23 by silicon oxide, again typically silicon dioxide, having a thickness of approximately 500 to 1000 Å.

Another metallization structure, 25, is shown in FIG. 4 making ohmic contact to region 24. Metallization interconnection 25 serves as the source or column line for the memory cell of FIG. 1.

Figure 5:
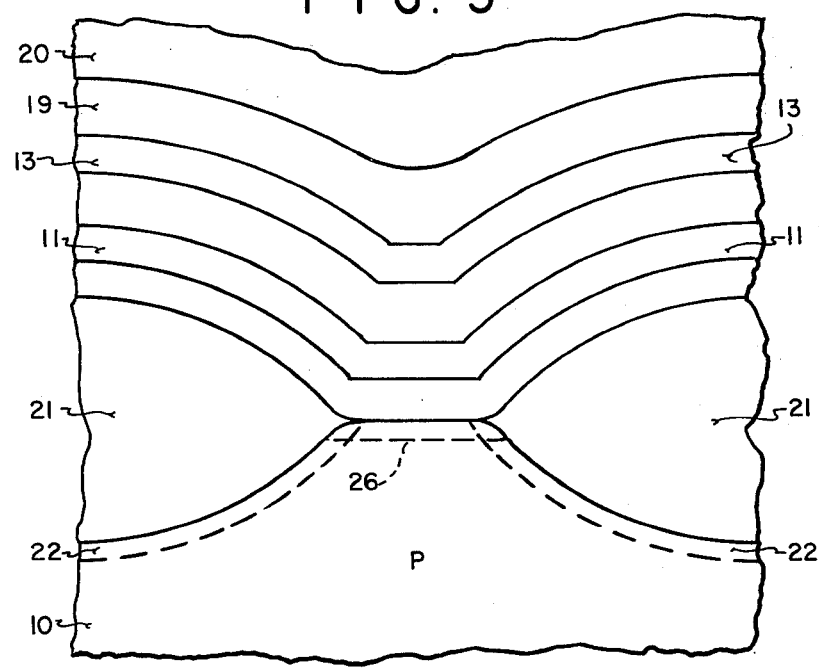
FIG. 5 is a cross section view of a portion of the monolithic integrated circuit of FIG. 1.

The last cross section from FIG. 1 is shown in FIG. 5 across the memory transistor structure where again there is shown substrate 10 having field oxide regions 21 thereon with channel stop regions 22 provided again below field oxide regions 21 just as in FIG. 3. First layer polysilicon structure 11 is again shown serving as the gate for the memory transistor. Again, above structure 11, is second layer polysilicon structure 13 as part of the capacitor structure formed with structure 11. Protecting structure 13 is again the protective region 19, which in turn has passivation layer 20 thereon. Further shown in FIG. 5 is the threshold voltage adjustment implantation region, 26, for adjusting the threshold voltage of the memory transistor, if desired. This is formed by an implantation of arsenic or boron ions with a dose depending on the threshold voltage desired for the memory transistor.

Returning to FIG. 1, a further structure is set out there which has not appeared in any of the cross section views shown in FIGS. 2 through 5. This is an opening for a metallization interconnect structure, 27, which serves as the bit line for the memory cell of that figure. Metallization interconnection portion 27 is formed at the same time in the same manner as are metallization interconnection portions 18 and 25.

Operation of the memory cell device shown in FIGS. 1 through 5 is most easily explained by use of an equivalent circuit. Such an equivalent circuit is shown in the schematic diagram at FIG. 6. There the memory transistor is designated 30 and the select transistor is designated 31. The tunneling capacitance is designated 32 while the control transistor is designated 33. The capacitance structure formed by first layer polysilicon portion 11 and second layer polysilicon portion 13 is termed the overlap capacitance and is designated 34. The erase transistor is designated 35. First layer polysilicon portion 13 forming a floating gate is designated 36. The source or column line termination is designated 37. The termination for receiving a programming voltage is connected to the overlap capacitance and is designated 38. The termination connected to the erase transistor is designated 39. The word line terminations are designated 40 while the bit line termination is designated 41.

Figure 6:
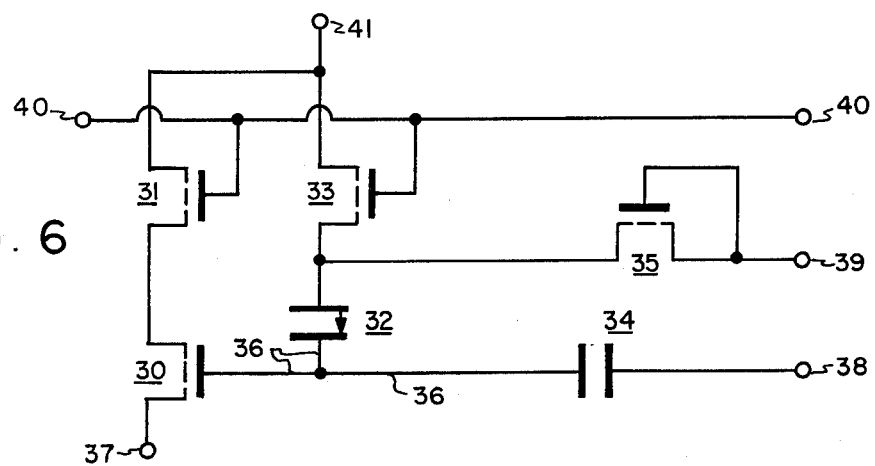
FIG. 6 is a circuit schematic diagram of an equivalent circuit representing that monolithic integrated circuit portion shown in FIG. 1.

There are three effective capacitances in the circuit of FIG. 6 for which values are appropriately set to provide for a properly operable memory cell and, as a result, the size of a properly operable memory cell. The first capacitance size determined is that of tunneling capacitance 32 which, to minimize cell extent, must have as small a plate area as possible consistent with obtaining a reliable silicon oxide dielectric between first layer polysilicon structure 11 and diffusion region 12, which must be carefully provided for because of the extreme thinness of the silicon oxide required to permit tunneling. A typical tunneling capacitance plate surface area would be on the order of 6 μm$^2$ which leads to a capacitance value of approximately $1.9 \times 10^{-14}$ farads. Overlap capacitance 34 occurring between first layer polysilicon structure 11 and second layer polysilicon structure 13 in FIGS. 1 through 5 must have a value substantially greater than that of the tunneling capacitance if "writing" and "erasing" are to be reliably performed in the memory cell of FIG. 1. A typical effective area of capacitive interaction for overlap capacitance 34 would be 95 μm$^2$ leading to a capacitance value of approximately $3.9 \times 10^{-14}$ farads. There will also be a capacitance relationship between floating gate 36 and other portions of memory transistor 30 which typically might be a capacitance value of approximately $0.6 \times 10^{-14}$ farads.

To "write" a state representing information in the memory cell equivalent circuit of FIG. 6 through placing electric charge on floating gate 36, the typical conditions would be to have about 21.0 volts placed on writing termination 38 and with approximately 5.0 volts on word line termination 40. No voltage, i.e. zero volts, are provided at column line termination 37, erase termination 39 and bit line termination 41.

Before memory transistor 30 has ever been operated, the threshold of that transistor will be on the order of plus or minus 0.1 volts if threshold voltage adjust implantation region 26 of FIG. 5 is not present, or it will be on the order of 0.6 volts if this implantation region 26 in FIG. 5 is present, For the applications of the foregoing voltages to the terminations as indicated, the control transistor 33 will be switched into the "on" condition such that it becomes able to conduct between its effective drain region connected to tunneling capacitance 32 and its effective source region connected to bit line termination 41.

As a result, overlap capacitance 34, tunneling capacitance 32 and the capacitance associated with the memory transistor 30 begin to charge with an initial charging current passing through column line termination 37 which dies out rather quickly because of the relatively small capacitance associated with memory transistor 30. On the other hand, a substantial current flows through tunneling capacitance 32 and transistor 33 upon the initial application of voltage to writing line termination 38. Because of capacitive voltage divider action, there will initially be on the order of 12.0 to 13.0 volts appearing on floating gate 36 leading to an electric field on the order of $10 \times 10^7$ volts per centimeter occurring across the thin oxide of the tunneling capacitance 32.

During tunneling, the voltage on floating gate 36 decreases and so does the tunneling current through the thin oxide serving as a dielectric for that capacitance. Subsequent removal of the 21.0 volts from writing termination 38 results in a net electronic accumulation on floating gate 36 which effectively increases the threshold voltage of memory transistor 30 to approximately 6 volts.

In the converse operation of "erasing" the information in the memory cell of FIG. 6 through removing electrons earlier accumulated on floating gate 36, approximately 21.0 volts is applied to erase termination 39 and zero volts to all other terminations shown in FIG. 6. Alternatively, a voltage on the order of 5.0 volts could be applied to both word line termination 40 and bit line termination 41 to reduce the amount of leakage current which will occur through control transistor 33, current which must otherwise be supplied by the voltage generator providing the 21.0 volts.

Again there will be a charging of the capacitances present with an initial current through erase transistor 35, operated with the gate connected effectively to the drain thereof, through tunneling capacitance 32 and the capacitance associated with memory transistor 30. This current will quickly die away because of the small capacitance value associated with transistor 30. A substantially larger current will be established through erase transistor 35, tunneling capacitance 32 and overlap capacitance 34 with capacitive voltage dividing action leading to there being on the order of 5.5 volts provided on floating gate 36 if the voltage contribution due to the already accumulated electrons is ignored. Thus, the voltage across the thin oxide of tunneling capacitance 32 due only to the application of the 21.0 volt erase voltage at erase termination 39 will be on the order of again of 13.0 volts leading to an electric field on the order of $10^7$ volts per centimeter. Again, this field is enough to cause tunneling of the electrons on floating gate 36 through the thin oxide of the tunneling capacitance 32 into diffusion region 12 as shown in FIG. 2.

Note in these circumstances that the presence of electrons on floating gate 36 will serve to increase the actual electric field occurring in the thin oxide of tunneling capacitance 32 with the result that the electrons on floating gate 36 are aided in tunneling through this thin oxide. Once the tunneling has removed the excess electrons on floating gate 36 and begins to remove further electrons so that a positive charge occurs on floating gate 36, the electric field due to such positive charge reduces in the tunneling capacitance oxide and tends to reduce further tunneling of electrons from floating gate 36 through the oxide.

If the erase voltage remains applied for sufficient time on erase termination 39, the effective increase in positive charge on floating gate 36 will effectively lead to a threshold voltage for memory transistor 30 which is negative such that that transistor will operate in the depletion mode. If the erase voltage is removed from termination 39 earlier, the effective threshold voltage on transistor 30 may be such that transistor 30 is either in the depletion mode or in the enhancement mode.

In both of the previous operations, the currents present flowed through capacitances which means that the currents eventually were reduced in value and, because of the small capacitances, were never too large in any event. Thus, it is possible to use a voltage generator capable of generating around 21.0 volts which does not have to supply very much electrical power in either the writing or the erasing of the memory cell of FIG. 6. This makes possible the inclusion of such a voltage generator for writing and erasing on the same monolithic integrated circuit chip as has an array of memory cells like that shown in equivalent circuit form in FIG. 6. That is, the voltage generator circuitry need not be provided off the chip for the purposes of generating such voltages in order to provide the needed electrical power. The need for a voltage generator which provided voltages of around 21.0 volts and which could also supply the substantial amount of electrical power consumed by the memory cells of some earlier designs led to having to provide such a voltage generator in circuitry external to the monolithic integrated circuit chip in which the memory cells were formed.

The erase operation described above is a erase operation which erases all the memory cells present on the chip of the nature shown in FIG. 6 since no selection process is used to determine which cells become erased. That is, the application of the erase voltage to erase termination 39 is sufficient to remove the accumulated electrons on floating gate 36 without the need of any voltages appearing on the word or bit line terminations of FIG. 6.

To "read" the state of the circuit in FIG. 6, i.e. to determine whether or not electrons have been accumulated on floating gate 36 indicating whether or not the memory cell has been "written" or "erased" or never charged, typically 5.0 volts is applied to writing termination 38 with 2.5 volts provided to bit line termination 41. A voltage on the order of 5.0 volts is also applied to word line termination 40 with zero volts being applied to erase termination 39 and to column line termination 37. Voltages with values as small as these will result in extremely low tunneling occurring through tunneling capacitance 32 and so the state of memory cell shown in FIG. 6 will not be noticeably altered by the application of such voltages. If the memory cell of the circuit of FIG. 6 has been written into so as to change the state thereof by accumulating electrons on floating gate 36, the effective threshold of memory transistor 30 is on the order of 6 volts and the application of 5 volts to writing termination 38 will be insufficient to place memory transistor 30 in the "on" condition. As a result, no current will flow through column termination 37 to be sensed by a sense amplifier or other means in the memory system.

On the other hand, if the state of the circuit in FIG. 6 is such that it has been erased or never written into, and consequently, there is no accumulation of electrons on floating gate 36 such that memory transistor 30 has a threshold of 2.0 volts or less, the 5.0 volts applied to writing termination 38 will be sufficient to place memory transistor 30 in the "on" condition. This results in permitting current to flow through bit line termination 41, control transistor 31, which is in the "on" condition because of the application of 5.0 volts to word line termination 40, memory transistor 30 and through column termination 37 to be sensed by a sense amplifier or other means in the memory system.

The circuit of FIG. 6 provided as a memory cell on a monolithic integrated circuit chip having an interval high voltage generator can be alternatively used with an external circuit high voltage generator in the conventional manner if desired. This would be done by disconnecting the internal circuit high voltage generator in the monolithic integrated circuit chip from erase termination 39 through appropriate internal logic on the chip. Then for the erasing operation, an external high voltage generator would supply voltage to word line termination 40 through a decoder and also supply high voltage to bit line termination 41 through another decoder. Thus, control transistor 33 will be switched into the "on" condition by the voltage available at word line termination 40 and high voltage present on bit line termination 41 will be applied to tunneling capacitance 32 through control transistor 33. This means that bit-by-bit memory erasure is possible in addition to erasing the entire memory in one step. The writing operation will be performed just as described above except that an external high voltage generator will provide high voltage to the writing termination 38 as the internal voltage generator will have been disconnected through appropriate internal logic on the monolithic integrated circuit chip. The read operation described above will be performed in just that same manner set out above in this alternative arrangement with an external high voltage generator used for the writing and erasing operations.

Figure 7:
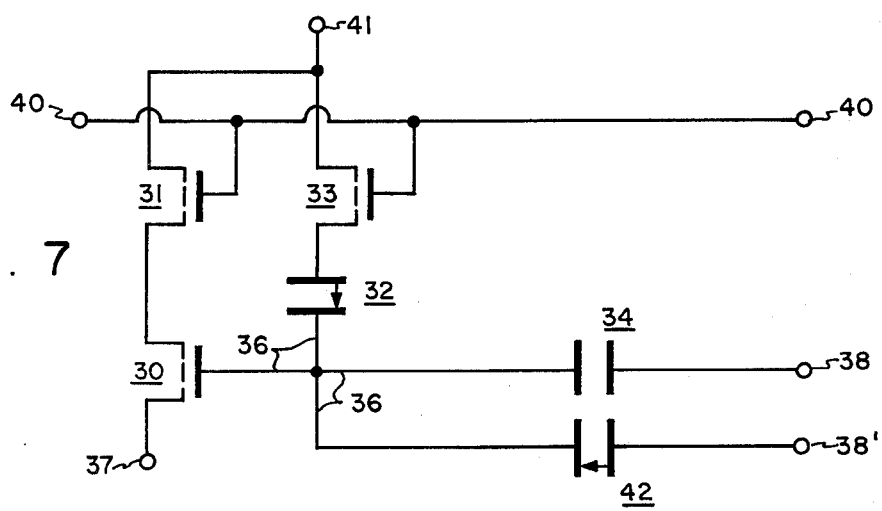
FIG. 7 is a circuit schematic diagram of an equivalent circuit representing a variant of that monolithic integrated circuit portion shown in FIG. 1.

A variant of the memory cell shown in FIG. 6 is shown in equivalent circuit form in FIG. 7 where erase transistor 35 of FIG. 6 has been replaced by discharge capacitance, 42, again based on Fowler-Nordheim tunneling, with one side of capacitance 42 formed by floating gate 36 and the other side thereof formed by another n+-type conductivity region similar to region 12 of FIG. 2 associated with tunneling capacitance 32. This n+-type conductivity region forming the other side of discharge capacitance 42 is then connected to a charging termination designated 39' in FIG. 7. In operation, floating gate 36 is charged through writing termination 38 and overlap capacitance 34 just as described for the circuits of FIG. 6, but is discharged through discharge capacitance 42. When writing into the memory cell circuit of FIG. 7, the voltage applied to discharging termination 39' is typically 16.0 volts, while the writing voltage is typically about 21.0 volts. During erasing, the discharging voltage is again typically 16.0 volts, but the writing voltage is set at zero volts. During the read mode, the voltage applied to termination 39' is zero volts, while the voltage applied to writing termination 38 is 5.0 volts. A typical set of capacitance values for a memory cell in an equivalent circuit shown in FIG. 7 would be having both the tunneling capacitances equal to $1.8 \times 10^{-14}$ farads with the overlap capacitance having a value of equal to approximately $10 \times 10^{-14}$ farads, and the memory transistor associated capacitance having a value on the order of $0.9 \times 10^{-14}$ farads.

The fabrication of the memory cell device shown in FIGS. 1 through 5, and for a cell represented by the equivalent circuit of FIG. 7, relies on conventional fabrication steps which are well known. Generally, a boron doped silicon substrate has a silicon nitride layer provided thereon with openings where field oxide regions are desired. A thick field oxide is grown in these openings through which the silicon substrate has previously been doped with boron to form implant regions, to prevent channeling during operation. Thereafter, the silicon nitride is removed and a masking step is performed to provide for ion implantation of the channel region of the memory transistor if there is a desire to adjust the threshold voltage of the memory device. Then a gate oxide is grown for the memory transistor and, thereafter, a masking and etching step is performed to provide an opening in this oxide in the region desired for the tunneling capacitance. A phosphorus implantation is then made through this opening and, thereafter, a thin tunneling oxide is grown in this opening.

Next, the first layer of polysilicon is formed over the silicon oxide present over all of the surface of the chip and doped with phosphorus. A masking and etching step is then used to define the portions of the first layer of polysilicon which at this point are to remain. This is followed by other well-known masking, etching and diffusion steps used in forming other circuit portions provided on the monolithic integrated circuit chip containing the memory cell. Then an oxide layer is formed over the surface of the chip including over the remaining portions of the first polysilicon layer. Openings are made in this silicon oxide layer by masking and etching to permit forming of buried contacts by the second polysilicon layer about to be provided, such as the buried contacts shown on the left side of FIG. 2.

Thereafter, the second layer of polysilicon is deposited on this last silicon oxide layer and on the exposed portions of the substrate through the openings prepared in this silicon oxide which is then doped with phosphorus. A masking and etching step is employed to define which of the portions of the second layer of polysilicon are to remain. After the unwanted portions of the second layer of polysilicon are etched away, another etching step is performed on the oxide below these remaining portions of the second layer of polysilicon and on the portions of the first layer of polysilicon uncovered by etching this oxide, and on the silicon oxide exposed by removing the first layer of polysilicon. As a result, these are all etched such that the first layer of polysilicon portions remaining are in alignment vertically with corresponding portions remaining of the second layer of polysilicon such that there are no portions of the first layer of polysilicon remaining uncovered by the second layer of polysilicon. Then either phosphorus or arsenic dopants can be used in an implantation in the exposed portions of the substrate to form the source and drain regions therein in correspondence with the remaining portions of the second layer of polysilicon and, where remaining, with portions of the first layer of polysilicon.

Next, a protective layer is provided over those structures remaining on the chip after the previous steps, a layer upon which well-known steps are next used to provide the metallization interconnections. Finally, a passivation layer is provided over the portions remaining on the chip followed by providing contact pads in a known manner.

The embodiments of the invention in which an exclusive property or right is claimed are defined as follows:

1. A non-volatile memory cell, said memory cell comprising:

a series combination of a fixed threshold switching means and of an essentially variable threshold switching means each having first and second terminating regions and a control region therein by which each is capable of being directed to effectively provide a conductive path of a selected conductivity between said first and second terminating regions therein, said essentially variable threshold switching means control region being electrically isolated from said essentially variable threshold switching means first and second terminating regions to prevent, at sufficiently small voltages thereacross, any electrical currents from traversing between said essentially variable threshold switching means control region and either of said first and second terminating regions of said essentially variable threshold switching means, said fixed threshold switching means first terminating region being electrically connected to a first terminal means adapted for electrical connection to a first selection means, said fixed threshold switching means control region being electrically connected to a second terminal means adapted for electrical connection to a second selection means, said fixed threshold switching means second terminating region being electrically connected to said essentially variable threshold switching means first terminating region, and said essentially variable threshold switching means second terminating region being electrically connected to a third terminal means adapted for electrical connection to a third selection means;

a tunneling capacitance means having first and second polarity regions partially electrically isolated from one another to prevent, at sufficiently small voltages therebetween, any significant electrical currents from traversing between said tunneling capacitance means first and second polarity regions but to permit significant electrical currents to traverse between said tunneling capacitance means first and second polarity regions at larger voltages though these be voltages which are still sufficiently small to prevent electrical currents from traversing between said essentially variable threshold switching means control region and either of said first or second terminating regions of said essentially variable threshold switching means, said tunneling capacitance means second polarity region being electrically connected to said essentially variable threshold switching means control region;

a coupling capacitance means having first and second polarity regions electrically isolated from one another to prevent any electrical currents from traversing between said coupling capacitance means first and second polarity regions, at voltages therebetween similar to those for which electrical isolation is maintained between said essentially variable threshold switching means control region and said essentially variable threshold switching means first and second terminating regions as aforesaid, said coupling capacitance means first polarity region being electrically connected to a fourth terminal means adapted for electrical connection to a fourth selection means, and said coupling capacitance means second polarity region being electrically connected to said essentially variable threshold switching means control region; and a control switching means having first and second terminating regions and a control region therein by which said control switching means is capable of being directed to effectively provide a conductive path of a selected conductivity between said control switching means first and second terminating regions, said control switching means first terminating region being electrically connected to a fifth terminal means adapted for electrical connection to a fifth selection means, said control switching means control region being electrically connected to a sixth terminal means adapted for electrical connection to a sixth selection means, and said control switching means second terminating region being electrically connected to said tunneling capacitance means first polarity region.

2. The apparatus of claim 1 wherein said first terminal means and said fifth terminal means are electrically interconnected and said first selection means and said fifth selection means are a common selection means.

3. The apparatus of claim 1 wherein said second terminal means and said sixth terminal means are electrically interconnected and said second selection means and said sixth selection means are a common selection means.

4. The apparatus of claim 1 wherein said fifth terminal means and said sixth terminal means are electrically interconnected and said fifth selection means and said sixth selection means are a common selection means.

5. The apparatus of claim 1 wherein there is further provided an erase means having first and second terminating regions and a control region therein by which said erase means is capable of being directed to effectively provide a conductive path of a selected conductivity between said erase means first and second terminating regions, said erase means first terminating region and said erase means control region both being electrically connected to a seventh terminal means adapted for electrical connection to a seventh selection means, and said erase means second terminating region being electrically connected to said tunneling capacitance means first polarity region.

6. The apparatus of claim 1 wherein there is further provided an erase means having first and second polarity regions partially electrically isolated from one another to prevent, at sufficiently small voltages therebetween, any significant electrical currents from traversing between said tunneling capacitance means first and second polarity regions but to permit significant electrical current to traverse between said tunneling capacitance means first and second polarity regions at larger voltages though these be voltages which are still sufficiently small to prevent electrical currents from traversing between said essentially variable threshold switching means control region and either of said first or second terminating regions of said essentially variable threshold switching means, said erase means first polarity region being electrically connected to a seventh terminal means adapted for electrical connection to a seventh selection means, and said erase means second polarity region being electrically connected to said essentially variable threshold switching means control region.

7. The apparatus of claim 2 wherein said second terminal means and said sixth terminal means are electrically interconnected and said second selection means and said sixth selection means are a common selection means.

8. The apparatus of claim 2 wherein said common selection means is capable of providing voltages of selected values to said first and fifth terminal means.

9. The apparatus of claim 3 wherein said common selection means is capable of providing voltages of selected values to said second and sixth terminal means.

10. The apparatus of claim 4 wherein said common selection means is capable of providing voltages of selected values to said fifth and sixth terminal means.

11. The apparatus of claim 7 wherein there is further provided an erase means having first and second terminating regions and a control region therein by which said erase means is capable of being directed to effectively provide a conductive path of a selected conductivity between said erase means first and second terminating regions, said erase means first terminating region and said erase means control region both being electrically connected to a seventh terminal means adapted for electrical connection to a seventh selection means, and said erase means second terminating region being electrically connected to said tunneling capacitance means first polarity region.

12. The apparatus of claim 7 wherein there is further provided an erase means having first and second polarity regions partially electrically isolated from one another to prevent, at sufficiently small voltages therebetween, any significant electrical currents from traversing between said tunneling capacitance means first and second polarity regions but to permit electrical current to traverse between said tunneling capacitance means first and second polarity regions at larger voltages though these be voltages which are still sufficiently small to prevent electrical currents from traversing between said essentially variable threshold switching means control region and either of said first or second terminating regions of said essentially variable threshold switching means, said erase means first polarity region being electrically connected to a seventh terminal means adapted for electrical connection to a seventh selection means, and said erase means second polarity region being electrically connected to said essentially variable threshold switching means control region.

13. The apparatus of claim 11 wherein that selection means common to said first and fifth selection means is capable of providing voltages of selected values at said first and fifth terminal means, that selection means common to said second and sixth selection means is capable of providing voltage of selected values at said second and sixth terminal means, said third selection means being capable of selecting for further use significant signals occurring on said third terminal means, said fourth selection means is capable of providing voltages of selected values on said fourth terminal means, and said seventh selection means is capable of providing voltages of selected values on said seventh terminal means.

14. The apparatus of claim 13 wherein said fixed threshold switching means, said control switching means and said erase means are enhancement mode, insulated gate field-effect transistors, and said essentially variable threshold switching means is an insulated gate field-effect transistor.

15. A non-volatile memory cell device, said device comprising:

a semiconductor body of a first conductivity type in at least a first portion thereof, except in selected regions in said first body portion including first, second, third, fourth, fifth, sixth, seventh, eighth and ninth selected regions, said semiconductor material body having a first major surface wherein said first body portion intersects said major surface to form a first major surface portion;

a series combination of a select insulated gate field-effect transistor and of a memory insulated gate field-effect transistor each having a pair of terminating regions therein serving as a source and drain thereof and each having at least one gate region therein, said select insulated gate field-effect transistor first terminating region being said first selected region which intersects said first major surface portion and which is electrically connected to a first terminal means adapted for electrical connection to a first selection means, said select insulated gate field-effect transistor gate being electrically connected to a second terminal means adapted for electrical connection to a second selection means, said select insulated gate field-effect transistor second terminating region being said second selected region which intersects said first major surface portion, said memory insulated gate field-effect transistor first terminating region being said third selected region which intersects said first major surface portion and which is electrically connected to said select insulated gate field-effect transistor second terminating region, said memory insulated gate field-effect transistor gate being a first extended conductor electrically isolated, at least everywhere except at a first tunneling region thereof, from other conductive portions of said cell at sufficiently small voltages therebetween to prevent any significant electrical currents from traversing therebetween, and said memory insulated gate field-effect transistor second terminating region being said fourth selected region which intersects said first major surface portion and which is electrically connected to a third terminal means adapted for electrical connection to a third selection means;

a tunneling capacitance formed by said fifth selected region where said fifth selected region intersects said first major surface portion and by adjacent said tunneling region of said first extended conductor with said fifth selected region and said first extended conductor being separated by a first insulating layer sufficiently thin to permit significant electron tunneling currents to traverse between said fifth selected region and said first extended gate conductor at sufficiently large voltages but at voltages which are also sufficiently small so as to maintain that electrical isolation otherwise characterizing said first extended conductor as aforesaid, said fifth selected region being electrically isolated from said first, second, third and fourth selected regions to prevent any currents from traversing between said fifth selected region and any of said first, second, third or fourth selected regions at sufficiently small voltages therebetween;

a coupling capacitance formed by said first extended conductor and a second extended conductor paralleling at least a substantial portion of said first extended conductor and separated therefrom by a second insulating layer, said second extended conductor being electrically connected to a fourth terminal means adapted for electrical connection to a fourth selection means; and a control insulated gate field-effect transistor having a pair of terminating regions therein serving as a source and drain thereof and having a gate therein, said control insulated gate field-effect transistor first terminating region being said sixth selected region which intersects said first major surface portion and which is electrically connected to a fifth terminal means adapted for electrical connection to a fifth selection means, said control insulated gate field-effect transistor gate being electrically connected to sixth terminal means adapted for electrical connection to a sixth selection means, and said control insulated gate field-effect transistor second terminating region being said seventh selected region which intersects said first major surface portion and which is electrically connected to said fifth selected region.

16. The apparatus of claim 15 wherein said first terminal means and said fifth terminal means are electrically interconnected and said first selection means and said fifth selection means are a common selection means.

17. The apparatus of claim 15 wherein said second terminal means and said sixth terminal means are electrically interconnected and said second selection means and said sixth selection means are a common selection means.

18. The apparatus of claim 15 wherein said fifth terminal means and said sixth terminal means are electrically interconnected and said fifth selection and said sixth selection means are a common selection means.

19. The apparatus of claim 15 wherein there is further provided an erase insulated gate field-effect transistor having a pair of terminating regions therein serving as a source and drain thereof and having a gate therein, said erase insulated gate field-effect transistor first terminating region, serving as said eighth selected region and which intersects said first major surface portion, and said erase insulated gate field-effect transistor gate together being electrically connected to a seventh terminal means adapted for electrical connection to a seventh selection means, and said erase insulated gate field-effect transistor second terminating region being said ninth selected region which intersects said first major portion and which is electrically connected to said fifth selected region.

20. The apparatus of claim 13 wherein there is further provided an erase tunneling capacitance formed by said eighth selected region where said eighth selected region intersects said first major surface portion and by an adjacent second tunneling region of said first extended conductor with said first eighth selected region and said first extended conductor being separated by a first insulating layer sufficiently thin to permit significant electron tunneling currents to traverse between said eighth selection region and said first extended gate conductor at sufficiently large voltages but at voltages which are also sufficiently small so as to maintain that electrical isolation effectively otherwise characterizing said first extended conductor as aforesaid, said eighth selected region being electrically connected to a seventh terminal means adapted for electrical connection to a seventh selection means.

21. The apparatus of claim 15 wherein said second and third selected regions are a single common region, and said fifth and seventh selected regions are a single common region.

22. The apparatus of claim 16 wherein said second terminal means and said sixth terminal means are electrically interconnected and said second selection means and said sixth selection means are a common selection means.

23. The apparatus of claim 16 wherein said common selection means is capable of providing voltages of selected values to said first and fifth terminal means.

24. The apparatus of claim 16 wherein said first and sixth selected regions are a single common region.

25. The apparatus of claim 17 wherein said common selection means is capable of providing voltages of selected values to said second and sixth terminal means.

26. The apparatus of claim 17 wherein said select insulated gate field-effect transistor gate and said control insulated gate field-effect transistor gate are formed in common by a third extended conductor.

27. The apparatus of claim 18 wherein said common selection means is capable of providing voltages of selected values to said fifth and sixth terminal means.

28. The apparatus of claim 22 wherein there is further provided an erase insulated gate field-effect transistor having a pair of terminating regions therein serving as a source and drain thereof and having a gate therein, said erase insulated gate field-effect transistor first terminating region, serving as said eighth selected region and which intersects said first major surface portion, and said erase insulated gate field-effect transistor gate together being electrically connected to a seventh terminal means adapted for electrical connection to a seventh selection means, and said erase insulated gate field-effect transistor second terminating region being said ninth selected region intersecting said first major portion and which is electrically connected to said fifth selected region.

29. The apparatus of claim 22 wherein there is further provided an erase tunneling capacitance formed by said eighth selected region where said eighth selected region intersects said first major surface portion and by an adjacent second tunneling region of said first extended conductor with said eighth selected region and said first extended conductor being separated by a first insulating layer sufficiently thin to permit electron tunneling currents to traverse between said eighth selection region and said first extended gate conductor at sufficiently large voltages but at voltages which are also sufficiently small so as to maintain that electrical isolation effectively otherwise characterizing said first extended conductor as aforesaid, said eight selected region being electrically connected to a seventh terminal means adapted for electrical connection to a seventh selection means.

30. The apparatus of claim 22 wherein said first and sixth selected regions are a single common region, said second and third selected regions are a single common region, said fifth and seventh selected regions are a single common region, and said select insulated gate field-effect transistor gate and said control insulated gate field-effect transistor gate are formed in common by a third extended conductor.

31. The apparatus of claim 28 wherein that selection means common to said first and fifth selection means is capable of providing voltages of selected values at said first and fifth terminal means, that selection means common to said second and sixth selection means is capable of providing voltage of selected values at said second and sixth terminal means, said third selection means being capable of selecting for further use significant signals occurring on said third terminal means, said fourth selection means is capable of providing voltages of selected values on said fourth terminal means, and said seventh selection means is capable of providing voltages of selected values on said seventh terminal means.

32. The apparatus of claim 28 wherein said first and sixth selected regions are a single common region, said second and third selected regions are a single common region, and fifth, seventh and ninth selected regions are a single common region, and said select insulated gate field-effect transistor gate and said control insulated gate field-effect transistor gate are formed in common by a third extended conductor.

33. The apparatus of claim 31 wherein said select insulated gate field-effect transistor, said control insulated gate field-effect transistor and said erase insulated gate field-effect transistor are enhancement mode transistors.

34. The apparatus of claim 32 wherein said select insulated gate field-effect transistor, said control insulated gate field-effect transistor and said erase insulated gate field-effect transistor are enhancement mode transistors.

* * * * *